United States Patent
Curtis et al.

(10) Patent No.: US 8,057,850 B2
(45) Date of Patent: Nov. 15, 2011

(54) FORMATION OF COPPER-INDIUM-SELENIDE AND/OR COPPER-INDIUM-GALLIUM-SELENIDE FILMS FROM INDIUM SELENIDE AND COPPER SELENIDE PRECURSORS

(75) Inventors: Calvin J. Curtis, Lakewood, CO (US); Alexander Miedaner, Boulder, CO (US); Maikel Van Hest, Lakewood, CO (US); David S. Ginley, Evergreen, CO (US); Jennifer A. Nekuda, Lakewood, CO (US)

(73) Assignee: Alliance for Sustainable Energy, LLC, Golden, CO (US)

( * ) Notice: Subject to any disclaimer, the term of this patent is extended or adjusted under 35 U.S.C. 154(b) by 0 days.

(21) Appl. No.: 11/813,474

(22) PCT Filed: Nov. 9, 2006

(86) PCT No.: PCT/US2006/060756
§ 371 (c)(1),
(2), (4) Date: Jul. 6, 2007

(87) PCT Pub. No.: WO2008/057119
PCT Pub. Date: May 15, 2008

(65) Prior Publication Data
US 2009/0280598 A1   Nov. 12, 2009

(51) Int. Cl.
*B05D 5/06* (2006.01)
*B05D 3/02* (2006.01)
(52) U.S. Cl. .......................................... 427/74; 427/226
(58) Field of Classification Search .................... 427/74, 427/226
See application file for complete search history.

(56) References Cited

U.S. PATENT DOCUMENTS

| 5,441,897 | A | 8/1995 | Noufi et al. |
| 5,628,817 | A | 5/1997 | Fugleberg et al. |
| 6,126,740 | A | 10/2000 | Schulz et al. |
| 6,127,202 | A | 10/2000 | Kapur et al. |
| 6,368,892 | B1 | 4/2002 | Arya |
| 6,599,378 | B1 | 7/2003 | Hagiwara et al. |
| 6,830,778 | B1 | 12/2004 | Schulz et al. |
| 6,974,976 | B2 | 12/2005 | Hollars |
| 2004/0219730 | A1* | 11/2004 | Basol ............................ 438/200 |
| 2004/0261841 | A1 | 12/2004 | Negami et al. |
| 2005/0009225 | A1* | 1/2005 | Mitzi et al. ...................... 438/59 |

(Continued)

FOREIGN PATENT DOCUMENTS

CN  1547260   11/2004

OTHER PUBLICATIONS

Kerr et al., "Rapid Thermal Processing of CIS Precursors", IEEE, 2002.*

(Continued)

*Primary Examiner* — Michael Cleveland
*Assistant Examiner* — Robert Vetere
(74) *Attorney, Agent, or Firm* — Paul J. White; Cynthia S. Mitchell; John C. Stolpa

(57) ABSTRACT

Liquid-based indium selenide and copper selenide precursors, including copper-organoselenides, particulate copper selenide suspensions, copper selenide ethylene diamine in liquid solvent, nanoparticulate indium selenide suspensions, and indium selenide ethylene diamine coordination compounds in solvent, are used to form crystalline copper-indium-selenide, and/or copper indium gallium selenide films (66) on substrates (52).

27 Claims, 12 Drawing Sheets

U.S. PATENT DOCUMENTS

2005/0183767 A1     8/2005   Yu et al.
2005/0186342 A1     8/2005   Sager et al.

OTHER PUBLICATIONS

Kerr et al., "Rapid Thermal Processing of CIS Precursors," IEEE, pp. 676-679, 2002.*

Dhere, et al., "Low Toxic Processing of Thin and Ultra-Thin CIGSS Absorber Solar Cells", Florida Solar Energy Center, University of Central Florida.

Schulz et al., "CIGS films by Nanoparticle Spray Deposition: Attempts at Densifying a Porous Precursor", Electronic Materials, 1998.

NREL Disclosure Project Title: "Inkjet Direct Write Solar Cells", 2005.

Kapur et al., "Lab to Large Scale Transition for Non-Vacuum Thin Film CIGS Solar Cells", NREL/SR-520-37284, 2005.

Stanbery et al., "Reaction Engineering and Precursor Film Deposition for CIS Synthesis", Department of Chemical Engineering, University of Florida.

Kapur et al., Non-Vacuum Processing of CuIn1-xGax Se2 Solar Cells on Rigid and Flexible Substrates using Nanoparticle Precursor Inks, Thin Solid Films, 2003.

International Preliminary Report on Patentability dated May 22, 2009, for International Application No. PCT/US06/60756.

International Search Report dated Jul. 30, 2007, for International Application No. PCT/US06160756.

* cited by examiner

US 8,057,850 B2

FORMATION OF COPPER-INDIUM-SELENIDE AND/OR COPPER-INDIUM-GALLIUM-SELENIDE FILMS FROM INDIUM SELENIDE AND COPPER SELENIDE PRECURSORS

CONTRACTUAL ORIGIN

The United States Government has rights in this invention under Contract No. DE-AC36-99GO10337 between the United States Department of Energy and the National Renewable Energy Laboratory, a Division of the Midwest Research Institute.

BACKGROUND

Group IB-IIIA-VIA compounds, especially copper indium diselenide (CIS) and copper indium gallium diselenide (CIGS) compounds, are promising and much studied semiconductor materials for a number of thin-film semiconductor applications, not the least of which include absorber layers for solar cells, because the elements themselves are common and fairly inexpensive, and significant solar to electrical energy conversion efficiencies with CIS and CIGS absorber layers have been demonstrated. However, techniques for inexpensive production of consistently high quality Group IB-IIIA-VIA thin film semiconductor compounds needed for large scale commercial acceptance and applications have been elusive.

In general, the stoichiometry of Group IB-IIIA-VIA compounds that have exhibited the highest solar to electrical energy conversion efficiencies have been slightly poor, or at least not rich, in the Group IB component in relation to the Group IIIA component(s), which is sometimes called the I/III ratio. For example, in Group IB-IIIA-VIA compounds in which the Group IB component is copper, I/III ratios in a range of about 0.8 to 1.0 have demonstrated the best solar to electrical conversion efficiencies. When the I/III ratio exceeds 1.0, the Group IB-IIIA-VIA compounds become unstable and Group IB-VIA phases tend to form, which deteriorates the electrical characteristics of the material and adversely affects the solar energy conversion efficiency. Also, in general the larger the crystal grains of the Group IB-IIIA-VIA compounds, the better the electrical characteristics, which are directly related to the solar to electrical energy conversion efficiencies.

Unfortunately, such compositional control and uniformity with large grain polycrystalline film formation of Group IB-IIIA-VIA compounds over large substrate surface areas has not been easy to achieve. Most current CIS and CIGS production methods involve some kind of vacuum deposition technology, for example, physical vapor deposition, which typically has high capital costs as well as high production, costs. Therefore, there has been a long-time need for less expensive alternatives for producing consistent, high quality, crystalline or polycrystalline thin films of Group IB-IIIA-VIA compounds. In this regard, various combinations of thin films of CuSe, $Cu_2Se$, InSe, and $In_2Se_3$ are increasingly being studied for use as precursors to achieve the production of large-grained $CuInSe_2$ films for solar cells. An emerging goal is to develop less costly, reproducible processes for making consistent, large-area, high quality CIS and/or CIGS absorber layers that do not involve vacuum deposition technologies. In this quest, thin films of CuSe, $Cu_2Se$, InSe, and $In_2Se_3$ that are not made with vacuum deposition technologies would be employed as precursors for the production of CIS and CIGS films for solar cells. These films are also being examined for use in thin film tandem cells and as channel layers in high performance transistors.

The foregoing examples and descriptions of the related art are intended to be generally illustrative and not exclusive. Other examples and limitations of the related art are known to persons skilled in the art or will become apparent to persons skilled in the art upon a reading of the specification and a study of the drawings.

BRIEF DESCRIPTION OF THE DRAWINGS

Example embodiments or features of example embodiments are illustrated in referenced figures of the drawings. It is intended that the embodiments and characteristics disclosed herein are to be considered illustrative and not exclusive or limiting. Therefore, in the drawings.

DETAILED DESCRIPTION OF EXAMPLE IMPLEMENTATIONS

Figure 1:
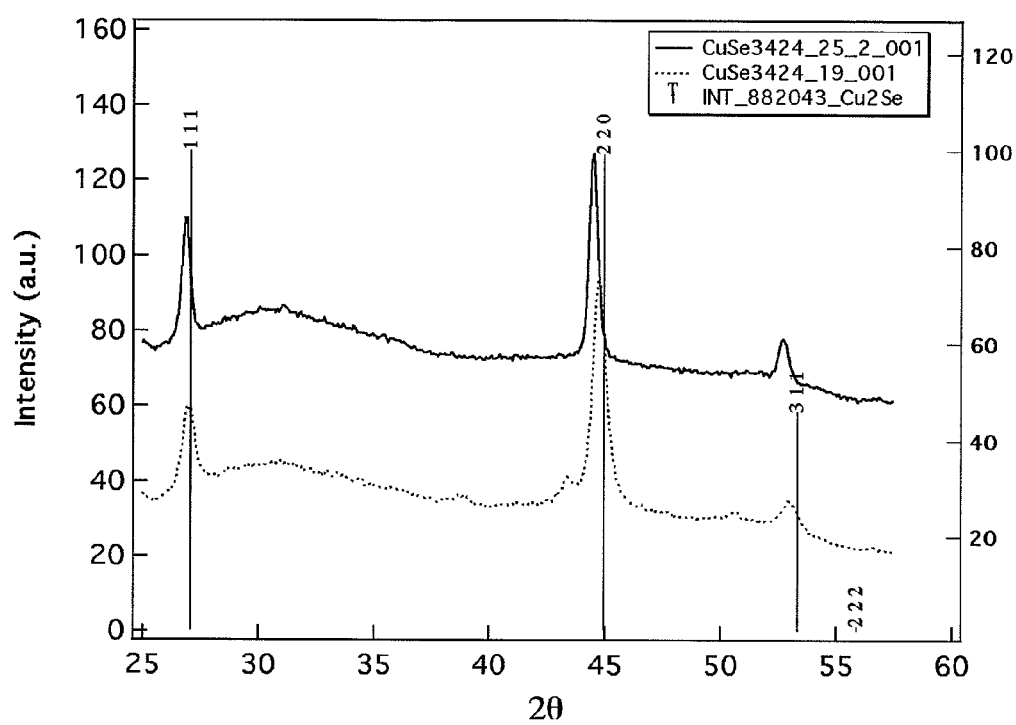
FIG. 1 shows X-ray diffraction (XRD) patterns of example $Cu_2Se$ films obtained from $[n\text{-}BuSeCu]_x$ (top trace) and $Cu_2Se_x(en)_y$ (bottom trace) after annealing at 350° C. in argon.

As explained above, thin films of CuSe, $Cu_2Se$, InSe, and $In_2Se_3$ are being studied for use as precursors for production of CIS and CIGS films without having to use vacuum deposition technologies. Also, it is advantageous to develop liquid-based precursors for Cu—Se, In—Se, CIS, and/or CIGS films for a number of reasons, including, but not limited to, the ease and variety of deposition techniques that can be used to deposit the precursor materials on substrates or other surfaces. Such deposition techniques may include, for example, but not for limitation, drop coating, dip coating, spin coating, spraying, brushing, air brushing, ink jet application, stamping, printing, pouring, wiping, smearing, or other methods of applying a liquid film on a surface. Some of the precursors described herein are soluble in solvents and, when dissolved, are in solutions, whereas others are mixtures or suspensions of the precursors in liquids. Therefore, for convenience and to avoid unduly restrictive constructions of terms and descriptions used herein, any precursor in a liquid solution, mixture, suspension, paste, or other form that can be handled and deposited on a surface with a technique or equipment that is usable for liquids, including, but not limited to, those mentioned above, may be referred to interchangeably as liquid, liquid-based, solution, or solution-based precursor. Also, the terms deposited, dispersed, spread, applied, and other terms may be used interchangeably when referring to the placement of the liquids comprising one or more of the precursors on a substrate or other surface on which In—Se, Cu—Se, CIS, and/or CIGS is to be formed from the precursors, and the use of any one or more of such terms should not be construed as precluding or as not including such placement of the liquids in a manner that could be described by another one of such terms.

Example liquid-based or solution-based precursors described below for depositions of such CuSe, $Cu_2Se$, InSe, $In_2Se_3$, CIS, or CIGS films at atmospheric pressure are particularly desirable because of their simplicity, stability in air, and low cost. Examples of the resulting Cu—Se films and In—Se films have been shown to have good crystallinity, and such films or precursors for such films can be used as precursors for the production of CIS and CIGS films for solar cells and other applications. The Cu—Se notation used herein is generally used to refer generically to any compound of copper and selenium (for example CuSe, $Cu_2Se$, and others) and the In—Se notation used herein is generally used to refer generically to any compound of indium and selenium (for example InSe, $In_2Se_3$, and others). Also, CIS and CIGS can be represented by the general chemical formula of $CuIn_{1-x}Ga_xSe_2$, where $0 \leq x \leq 1$, or more simply as $Cu(In,Ga)Se_2$. Any or all of these abbreviations, chemical notations, and chemical formulae conventions may be used in this description. Also, when this description mentions copper-indium-selenide, copper indium diselenide, CIS, or $CuInSe_2$ in discussing applications for the example precursors described herein, persons skilled in the art will recognize that such materials are also applicable to production of other $Cu(In,Ga)Se_2$ compounds and are not intended to be limited to $CuInSe_2$.

The first example liquid-based $Cu_2Se$ precursor described herein is prepared as shown, for example, by the following chemical equation:

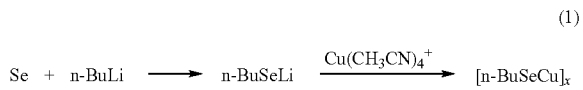

(1)

where Se is elemental selenium and n-BuLi is n-butyl lithium, which is a very reactive organolithium reagent that reacts with the selenium to form lithium n-butyl selenide (n-BuSeLi). The copper is introduced as a copper(I) salt, such as the copper acetonitrile $Cu(CH_3CN)^{4+}$ in equation (1), which reacts with the n-butyl selenide to form copper n-butyl selenide $[n\text{-BuSeCu}]_x$, where the subscripted x is used to denote that the [n-BuSeCu] units associate to form oligomers. The copper n-butyl selenide precipitates from the reaction mixture and is formulated as an oligomer of [n-BuSeCu] monomers. The $[n\text{-BuSeCu}]_x$ is then suspended in dimethyl sulfoxide (DMSO), which is a solvent, and ethanolamine, which functions as a dispersant for the $[n\text{-BuSeCu}]_x$ particles. This liquid suspension of the $[n\text{-BuSeCu}]_x$ is stable at room temperature and can be stored for long periods of time without deterioration, and it is stable enough to be deposited on a substrate or other surface by one or more of the techniques listed above, so it is considered to be a liquid-based precursor in this description.

To test the $[n\text{-BuSeCu}]_x$ suspension for use in forming films of $Cu_2Se$, it was drop-coated onto glass substrates and annealed at 350° C. in an argon atmosphere. The $[n\text{-BuSeCu}]_x$ precursor decomposed, and the organic components vaporized leaving a film of crystalline $Cu_2Se$, as shown by the X-ray diffraction (XRD) scan in FIG. 1. Therefore, this resulting crystalline $Cu_2Se$ film is a good candidate precursor for forming CIS and/or CIGS semiconductor materials for solar cell absorber layers or for other uses, and the copper n-butyl selenide suspension described above is a good liquid-based precursor for making the crystalline $Cu_2Se$ film.

Example I

A suspension of Se (0.79 g, 0.01 mole) in THF (50 ml) under nitrogen was treated with n-butyl lithium solution (4.0 mL of 2.5 M solution in hexanes, 0.01 mole). After stirring for 15 minutes, the Se dissolved completely to give a yellow solution of lithium n-butyl selenide. The lithium n-butyl selenide solution was then added to a solution of $[Cu(CH_3CN)_4](PF_6)$ (3.73 g, 0.01 mole) in $CH_3CN$ (50 mL), and a dark brown precipitate formed. This precipitated $[n\text{-BuSeCu}]_x$ was separated from the solution by centrifugation, washed with fresh THF (40 mL) and dried in a stream of $N_2$. A suspension of 0.10 g of this material in 5 mL DMSO plus 0.5 mL ethanolamine or 3.0 mL ethylene diamine was used for the depositions described. The suspension in DMSO/ethanolamine was drop coated onto a microscope slide and the resulting film was annealed at 350° C. in Ar to yield the crystalline $Cu_2Se$ film characterized in FIG. 1.

While the example described above has been shown to work well for making the copper n-butyl selenide precursor for the crystalline $Cu_2Se$ films, persons skilled in the art will recognize, after becoming familiar with the example, that other reagents with similar characteristics can be substituted for those used in the examples to get similar, if not even better, results. For example, there are a number of organolithium reagents that are reactive enough to react with the elemental selenium to provide alkyl or aryl selenium reagents to react with the copper salt, such as, but not limited to, t-butyl lithium, sec-butyl lithium, methyl lithium, phenyl lithium, tolyl lithium, xylyl lithium, and 2,6-diisopropylphenyl lithium. Also, the copper salt can be another organic copper salt, for example, copper(I) methoxide ($CuOCH_3$), or it can be an inorganic copper salt, for example, a copper halide, such as copper iodide (CuI), copper bromide, copper chloride, or any other copper(I) salt that reacts with the organoselenide reagents to precipitate copper-organoselenide monomers or oligomers that can be suspended and dispersed in a liquid for drop, spin, spray, or other deposition on a substrate, which upon heating to a temperature sufficient to decompose the copper-organoselenide precursor and drive off the organic residues, forms a crystalline $Cu_2Se$ film. Also, instead of DMSO, other solvents that can be used to disperse the copper-organoselenide precursor in the general method described above, for example, ethylene diamine. Also, ethanolamine, other secondary and tertiary amines can be used as complexing agents in order to form a liquid-based $Cu_2Se$ precursor that can be processed as described above to form a crystalline $Cu_2Se$ film.

Example II

A particulate $Cu_2Se$ precursor was also prepared. An aqueous solution of NaHSe was prepared by the reaction of Se (0.20 g, 0.0025 mole) in 10 mL H$_2$O with NaBH$_4$ (0.19 g, 0.005 mole) at 0° C. for 1 h. This solution was then added slowly over a period of 1 h to a solution of [Cu(CH$_3$CN)$_4$] (PF$_6$) (1.86 g, 0.005 mole) in CH$_3$CN (50 mL) at room temperature. The resulting black precipitate was collected by filtration, washed with water (50 mL) and CH$_3$CN (50 mL) and dried in a stream of N$_2$. This material was suspended in methanol, drop coated onto a microscope slide, and the resulting film was annealed at 350° C. in Ar to yield a crystalline Cu$_2$Se film.

Another liquid or solution-based precursor for crystalline Cu$_2$Se films can be obtained by reacting commercial Cu$_2$Se powder with elemental selenium and ethylene diamine (sometimes called 1,2-diaminoethane or abbreviated "en") as shown by the equation:

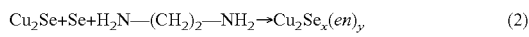

$$Cu_2Se + Se + H_2N-(CH_2)_2-NH_2 \rightarrow Cu_2Se_x(en)_y \quad (2)$$

where Cu$_2$Se is the commercial copper selenide powder, Se is the elemental selenium, the H$_2$N—(CH$_2$)$_2$—NH$_2$ is the ethylene diamine, and Cu$_2$Se$_x$(en)$_y$ is the copper selenide ethylene diamine compound, sometimes referred to as the Cu$_2$Se$_x$-ethylene diamine coordination compound or just Cu$_2$Se$_x$-ethylene diamine for convenience. The Cu$_2$Se$_x$(en)$_y$ forms a red solution in ethylene diamine. In the Cu$_2$Se$_x$(en)$_y$ produced according to equation (2), $1 \leq x \leq 12$ and $y \geq 1$. The exact number of ethylene diamine molecules in the Cu$_2$Se$_x$-ethylene diamine coordination compound is not significant for the application of the Cu$_2$Se$_x$-ethylene diamine coordination compound as a liquid or solution-based precursor for crystalline Cu$_2$Se as described herein, because any number of en's in the complex in this manner will be soluble at least in ethylene diamine. In an example analysis of Cu$_2$Se$_x$(en)$_y$ produced as described herein, x appeared to be 8, and y appeared to be 2. When the red solution of Cu$_2$Se$_x$(en)$_y$ in ethylene diamine produced from the synthesis in equation (2) was drop coated onto a glass substrate and annealed in argon at 350° C., the organic ligands were vaporized and driven out, Se was lost and crystalline Cu$_2$Se was formed in a crystalline thin film on the substrate, as shown by the X-ray diffraction pattern in FIG. 1. Therefore, the ethylene diamine solution of Cu$_2$Se$_x$(en)$_y$ is a viable liquid precursor for forming crystalline Cu$_2$Se, which in turn can be used as a precursor for forming CIS and/or CIGS semiconductor materials. This soluble red Cu$_2$Se$_x$(en)$_y$ precursor must be formed and stored under nitrogen or other oxygen-free condition to prevent oxidation of the copper, and it can be stored at room temperature. It can be deposited in air and survives deposition in air at 200° C. with no evidence of oxidation. It can also be diluted to any concentration desired for drop coating, dip coating, spin coating, spraying, ink jet application, or any other method of applying a uniform liquid film on a surface.

Example III

A mixture of Cu$_2$Se (2.06 g, 0.01 mole), Se (0.80 g, 0.01 mole), and ethylene diamine (30 mL) was sonicated under N$_2$ in a 600 W KONTES Sonicator for 6 hours to give a red solution comprising the Cu$_2$Se$_x$(en)$_y$ according to equation (2) as described above. This solution comprising the copper selenide ethylene diamine compound was filtered under N$_2$ to remove a small amount of solid and then used directly for depositions. The solution was drop coated onto a microscope slide, and the resulting film was annealed at 350° C. in Ar to yield the crystalline Cu$_2$Se film characterized in FIG. 1.

While the example described above has been shown to work well for the Cu$_2$Se$_x$(en)$_y$ precursor for making Cu$_2$Se films, persons skilled in the art will recognize, after becoming familiar with the example, that other reagents with similar characteristics can be substituted for the ethylene diamine used in the examples to get similar, if not even better, results. For example, the ethylene diamine is a di-functional basic ligand that forms a scaffold, which supports Cu$_2$Se$_x$ units in the 3-dimensional structure. Other such di-functional diamine ligands with similar characteristics can be used for this purpose instead of ethylene diamine, such as 1,3-diaminopropane or 1,2-diaminobenzene. Also, a number of solvents other than ethylene diamine, such as, for example, DMSO or dimethyl formamide (DMF), can be used to dissolve the Cu$_2$Se$_x$(en)$_y$ precursor for application of the precursor to a substrate. Essentially, any solvent that can dissolve the Cu$_2$Se$_x$(en)$_y$ precursor can be used.

As mentioned above, In$_2$Se$_3$ can also be used as one of the precursors for making CIS and/or CIGS semiconductor materials. An example precursor for making such In$_2$Se$_3$ precursor material is a nanoparticle In$_2$Se$_3$ material, denoted nano-In$_2$Se$_3$, which can be made as shown by the following equation:

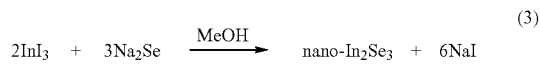

$$2InI_3 + 3Na_2Se \xrightarrow{MeOH} nano\text{-}In_2Se_3 + 6NaI \quad (3)$$

Figure 2:
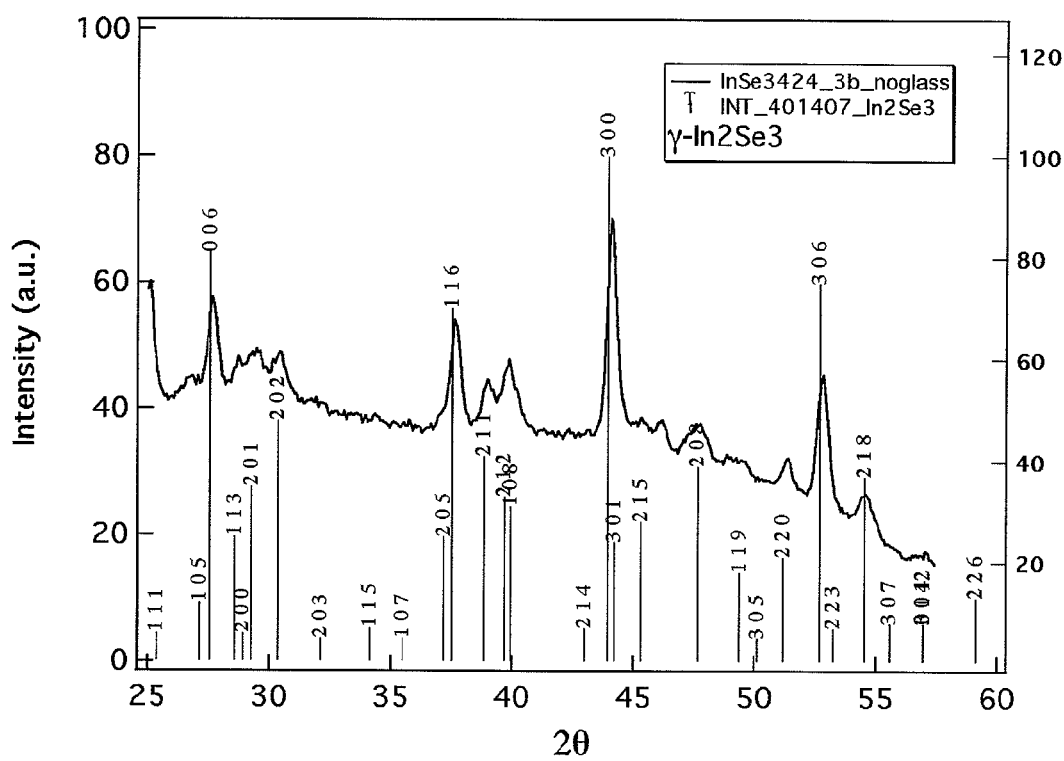
FIG. 2 shows an XRD scan of an example nanoparticle $In_2Se_3$ precursor annealed in a sealed tube at 350° C.

Essentially, indium iodide reacts with sodium selenide in methanol to form In$_2$Se$_3$ nanoparticles, i.e., particles less than 100 nanometers (nm) in diameter, which is also sometimes called nano-In$_2$Se$_3$ for convenience. When the NaI was washed away and these particles were annealed at 350° C. in a closed tube, crystalline In$_2$Se$_3$ was obtained, as shown by the X-ray diffraction scan in FIG. 2. This result demonstrates that the nanoparticle In$_2$Se$_3$ precursor can be processed to form large-grained crystalline material under mild conditions.

Figure 3:
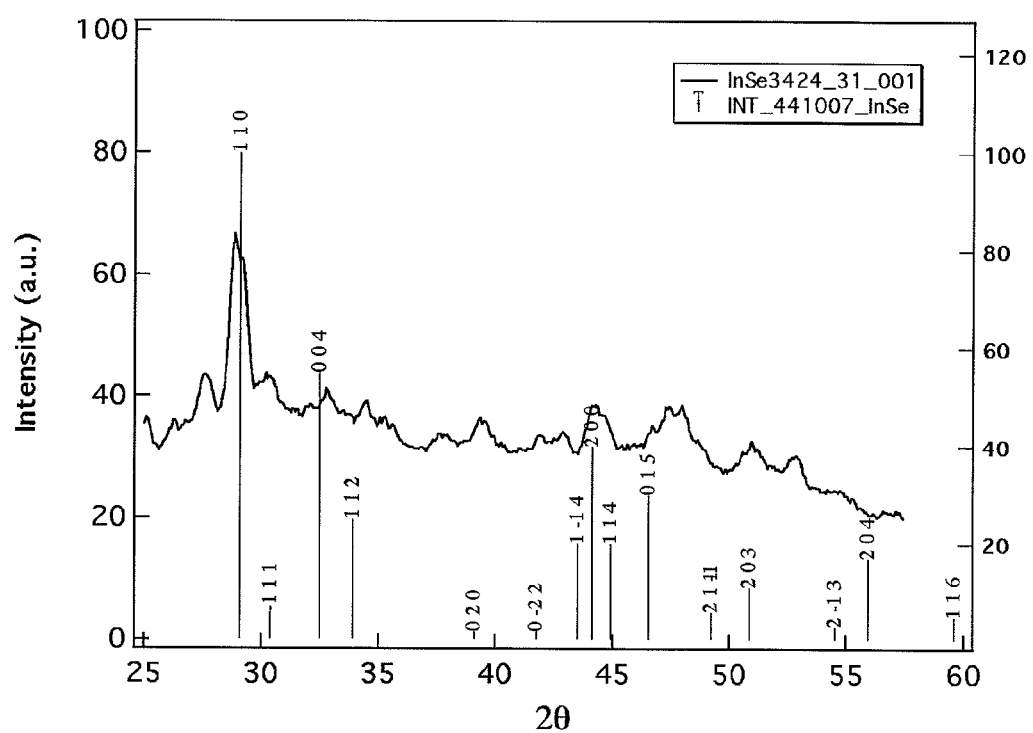
FIG. 3 shows an XRD scan of an example $In_2Se_3$ nanoparticle film annealed at 350° C. in flowing argon showing conversion to InSe.

On the other hand, when the nano-In$_2$Se$_3$ from equation (3) was deposited from a methanol slurry on glass, for example by drop coating the slurry onto a glass slide, and then annealed overnight (approximately twelve hours) at 350° C. in flowing argon, some Se was lost and a crystalline film of InSe was formed, as shown in FIG. 3. Crystalline InSe is a stoichiometric compound for which a standard XRD pattern is well known. FIG. 3 shows both the well-known standard XRD pattern for crystalline InSe and the XRD pattern for the material produced with this longer anneal time, which match and thereby show that the material was crystalline InSe.

However, when an identical precursor film was rapidly annealed at either 350° C. or 500° C. for five minutes, no selenium was lost and γ-In$_2$Se$_3$ was produced. Therefore, selenium loss can be mitigated by rapid thermal processing of the precursor films to produce γ-In$_2$Se$_3$ films starting from the nano-In$_2$Se$_3$ precursor instead of the crystalline InSe described above. The γ (gamma) indicates the crystalline structure of the In$_2$Se$_3$ compound, as is understood by persons skilled in the art. Rapid thermal processing (RTP) is a way of annealing samples by healing rapidly to a desired temperature, maintaining that temperature for a short time, and then cooling, as is understood by persons skilled in the art. In this case, for example, but not for limitation, an optical RTP furnace was used. This furnace uses intense light coupled to a silicon or carbon susceptor to heat the sample, and it is capable of heating a sample from room, temperature to 500° C. in about twenty seconds. The samples are typically maintained at the desired temperature for about two to eight minutes, although crystalline In$_n$Se$_3$ can be produced from these precursors by annealing in this manner for as much as fifteen minutes. When the light in the furnace is turned off, the sample also cools quickly because of the low thermal mass of the susceptor.

As mentioned above, either InSe or $In_2Se_3$ can also be used as a precursor for the formation of CIS and/or CIGS. Other forms of In—Se with the ratio of In to Se between that of InSe and $In_2Se_3$ can also be used as precursors for CIS and/or CIGS, and the nano-$In_2Se_3$ from equation (3) is a useful precursor for any of such crystalline In—Se compounds or films. In general, annealing the nano-$In_2Se_3$ from the slurry by RTP at any temperature in the range of 300 to 650° C. for a time in a range of two to fifteen minutes can be used to produce $\gamma$-$In_2Se_3$, whereas annealing in that temperature range for more than fifteen minutes will result in some loss of Se and the production of InSe. Example nano-$In_2Se_3$ precursors prepared according to equation (3), are explained in Examples IV and V below.

Example IV

A solution of $InI_3$ (0.99 g, 0.002 mole) in methanol (150 mL) was cooled to −80° C., and a solution of $Na_2Se$ (0.38 g, 0.003 mole) in methanol (50 mL) was added rapidly. The product precipitated immediately to form a yellow suspension comprising $In_2Se_3$. The yellow $In_2Se_3$ product was collected by centrifugation and washed with three 50 mL portions of fresh methanol. As the NaI was removed, the nano-$In_2Se_3$ dispersed better in methanol, and not all the product resettled after the third wash. The material was not dried, but it was re-suspended in 30 mL of methanol, and this suspension was used for In—Se depositions.

Equation (3) is a precipitation reaction in which indium (III) iodide ($InI_3$) reacts with sodium selenide ($Na_2Se$) to form the desired indium selenide in nanoparticulate form and sodium, iodide (NaI) as a byproduct. Methanol acts as the solvent for this reaction, and it was chosen because NaI remains soluble in methanol after the nano-$In_2Se_3$ precipitates, and it can be used to completely remove NaI from the product. This nano-$In_2Se_3$ precursor can be prepared easily in large amounts and stored for future use without noticeable degradation.

Example V

In another example, selenium (0.79 g, 0.01 mole) was suspended in degassed water, cooled in an ice bath and treated with solid $NaBH_4$ (0.76 g, 0.02 mole) in small portions. After stirring for one hour, a clear solution of NaHSe formed. This solution was added to a solution of $InI_3$ (1.48 g, 0.0066 mole) in methanol (60 mL) and the yellow product comprising the nano-$In_2Se_3$ precipitated immediately. This precipitate was collected and washed as in Example IV above, and it was re-suspended for deposition.

Figure 4:
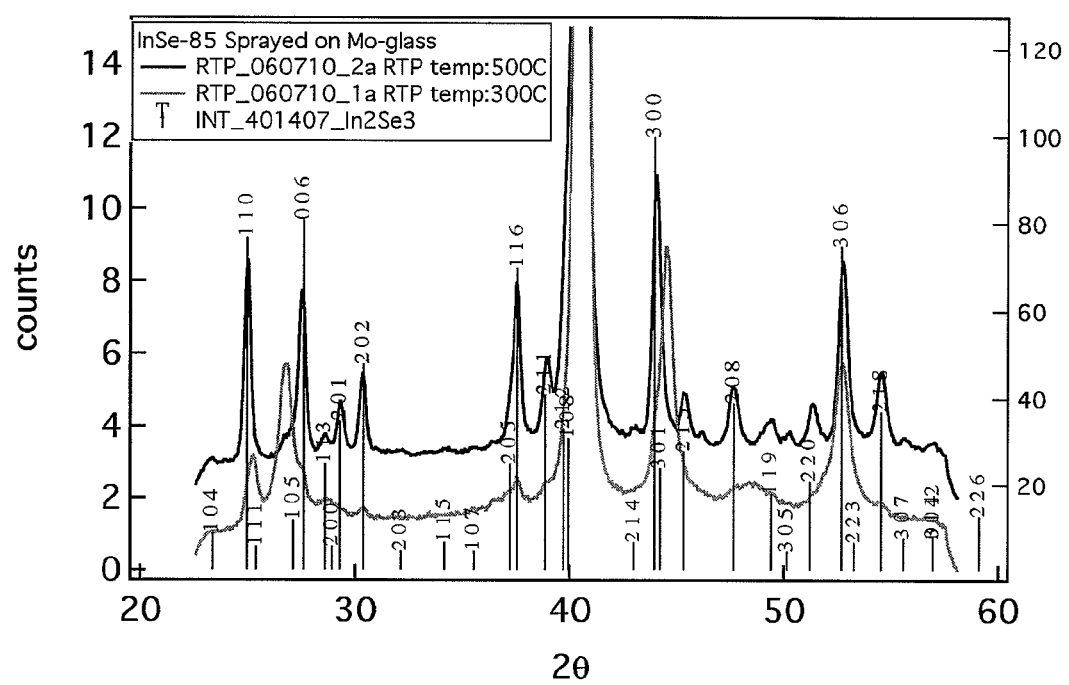
FIG. 4 shows XRD patterns for example indium selenide films made from the $In_2Se_4(enH)_x(N_2H_5)_{2-x}(en)_y(N_2H_4)_z$ precursor annealed at 300° C. and 500° C. showing conversion to a crystalline In—Se phase at the lower temperature and to crystalline $In_2Se_3$ at the higher temperature.

Another soluble precursor for crystalline In—Se films, which may be characterized by the general formula $In_2Se_4(enH)_x(N_2H_5)_{2-x}(en)_y(N_2H_4)_z$ and called $In_2Se_4$-ethylene diamine coordination compound, $In_2Se_4$-ethylene diamine complex, or just $In_2Se_4$-ethylene diamine for convenience, was prepared by reaction of commercial $In_2Se_3$, elemental Se, hydrazine, and ethylene diamine. The clear yellow solution that results from this reaction can be applied in liquid form onto glass or other suitable substrates by drop coating, dip coating, spin coating, spray, ink jet, or any other liquid application apparatus or method, which is a significant advantage. Decomposition of this precursor and film crystallization were studied using both conventional oven heating and rapid thermal processing (RTP). The $In_2Se_4(enH)_x(N_2H_5)_{2-x}(en)_y(N_2H_4)_z$ precursor solution was sprayed onto Mo-coated glass substrates and annealed by RTP at two different temperatures. The annealed films were characterized by XRD and the results are shown in FIG. 4. The lower trace in FIG. 4 shows the XRD pattern obtained for a sprayed film annealed at 300° C. for five minutes. It shows that a crystalline In—Se phase was produced. The upper trace in FIG. 4 shows the XRD pattern obtained from a similar sprayed $In_2Se_4(enH)_x(N_2H_5)_{2-x}(en)_y(N_2H_4)_z$ precursor film annealed at 500° C. for five minutes. A crystalline $\gamma$-$In_2Se_3$ film was obtained under these conditions. Therefore, this $In_2Se_4(enH)_x(N_2H_5)_{2-x}(en)_y(N_2H_4)_z$ is a versatile precursor that can be used to produce films of crystalline In—Se when annealed at 300-350° C., or to produce films of $\gamma$-$In_2Se_3$ when annealed at 400-500° C. Even higher annealing temperatures, e.g., 500 to 650° C., can be used to produce crystalline $\gamma$-$In_2Se_3$ from the $In_2Se_4(enH)_x(N_2H_5)_{2-x}(en)_y(N_2H_4)_z$ precursor if substrates that can withstand those temperatures are used. Also, longer anneal time, i.e., longer than fifteen minutes, for example, but not for limitation, in a conventional oven or furnace, will result in loss of Se and thereby production of some form of crystalline In—Se other than $\gamma$-$In_2Se_3$.

Specific examples of the use of this $In_2Se_4(enH)_x(N_2H_5)_{2-x}(en)_y(N_2H_4)_z$ precursor for the preparation of crystalline In—Se and crystalline $In_2Se_3$ film by RTP are described below.

Example VI

A mixture of $In_2Se_3$ (0.94 g, 0.002 mole), Se (0.16 g, 0.002 mole), ethylene diamine (5 mL) and anhydrous hydrazine (5 mL) was stirred for three days at room temperature. During this time, the solids dissolved and a clear yellow solution comprising the $In_2Se_4(enH)_x(N_2H_5)_{2-x}(en)_y(N_2H_4)_z$ precursor, i.e., $In_2Se_4$-ethylene diamine, was formed. This solution was then used directly for depositions of the In—Se films. When this $In_2Se_4(enH)_x(N_2H_5)_{2-x}(en)_y(N_2H_4)_z$ precursor solution was sprayed on Mo-glass substrates and then annealed at 300° C., for five minutes in argon, a crystalline In—Se film resulted. The XRD pattern presented in the lower trace in FIG. 4 indicates that this material is crystalline In—Se, as explained above. When a similar precursor film was annealed at 500° C. for five minutes in argon, the result was a crystalline $\gamma$-$In_2Se_3$ film, as shown by the upper trace in FIG. 4. The concentration of the $In_2Se_4(enH)_x(N_2H_5)_{2-x}(en)_y(N_2H_4)_z$ precursor was varied by using the same amounts of $In_2Se_3$ and Se with 7.5 and 10 mL portions of both ethylene diamine and hydrazine in subsequent preparations. The $In_2Se_4(enH)_x(N_2H_5)_{2-x}(en)_y(N_2H_4)_z$ precursor was also prepared in the same way using equal volumes of hydrazine hydrate and ethylene diamine with similar results.

Because the solution prepared for the reaction described above for producing the $In_2Se_4$-ethylene diamine, i.e., $In_2Se_4(enH)_x(N_2H_5)_{2-x}(en)_y(N_2H_4)_z$, precursor contains both ethylene diamine (en) and hydrazine ($N_2H_4$), and because both the en and $N_2H_4$ have comparable basicities, there are a number of specific formulation possibilities, one or more of which may be present in the solution. The possibilities all have an $In_2Se_4^{2-}$ core, but the ligands may include an all-en formula and/or mixed en/$N_2H_4$ structures, for example, $In_2Se_4(enH)_2(en)_y$, $In_2Se_4(enH)(N_2H_5)(en)_y$, $In_2Se_4(N_2H_5)_2(en)_y$, $In_2Se_4(enH)_2(en)_y(N_2H_4)_z$, $In_2Se_4(enH)(N_2H_5)(en)_y(N_2H_4)_z$, and/or $In_2Se_4(N_2H_5)_2(en)_y(N_2H_4)_z$. If more than one of these possibilities are present in the solution, they may be present in various proportions in equilibrium with each other. The enH is protonated en and serves the same purpose in the formulations as the protonated hydrazine, $N_2H_5$, which is to compensate the charge on the $In_2Se_4^{2-}$ core. Therefore, the enH and the $N_2H_5$ are interchangeable and can replace each other, as illustrated in the possible formulations listed above, and, in the general formula, $0 \leqq x \leqq 2$.

Some amount of ethylene diamine (en) is among the ligands of the possible formulations listed above, so y is always at least one, and it can be any number above one that forms in the reaction. As mentioned above, it is possible for the $In_2Se_4$-ethylene diamine complex produced by this reaction to contain only en ligands, so z can be either zero or any number above zero that forms in the reaction. Except for $y \geqq 1$ and $z \geqq 0$, as explained above, the values of y and z are not critical and can be any amounts that form in the reaction of $In_2Se_3$, Se, hydrazine, and ethylene diamine, because any amounts of en and $N_2H_4$ that get incorporated into the ligands will be soluble with the $In_2Se_4^{2-}$ core at least in ethylene diamine or in ethylene diamine/hydrazine mixtures, thus useable for making the In—Se and $In_2Se_3$ crystalline films, as described above.

As explained above, the precursor, $In_2Se_4(enH)_x(N_2H_5)_{2-x}(en)_y(N_2H_4)_z$, was made and used for depositing thin films of crystalline In—Se and $In_2Se_3$ with an ethylene diamine/hydrazine solution, so there was and is no need to isolate any particular $In_2Se_4$-ethylene diamine complex products from the solution or to determine specific numbers of (en) and $N_2H_4$ in a specific formulation or product of the reaction of $In_2Se_3$, Se, hydrazine, and ethylene diamine. However, such isolation can be done, if desired, and such isolated $In_2Se_4$-ethylene diamine complex products are re-soluble in ethylene diamine and/or ethylene diamine/hydrazine mixtures, and it is expected that they are also soluble in other solvents, such as, for example, DMSO.

As mentioned above, the Cu—Se and In—Se produced by the precursors described above can be used to fabricate CIS and/or CIGS films with good crystallinity and electrical characteristics that are suitable for many semiconductor and other applications, not the least of which includes absorber layers for solar cells and other photovoltaic devices. There are any number of variations and sequences of procedural steps or acts that can be used to fabricate CIS and/or CIGS films from the precursors discussed above, several examples of which will be described below as illustrations, not limitations, of such uses of the precursors for such films.

Figure 5A:
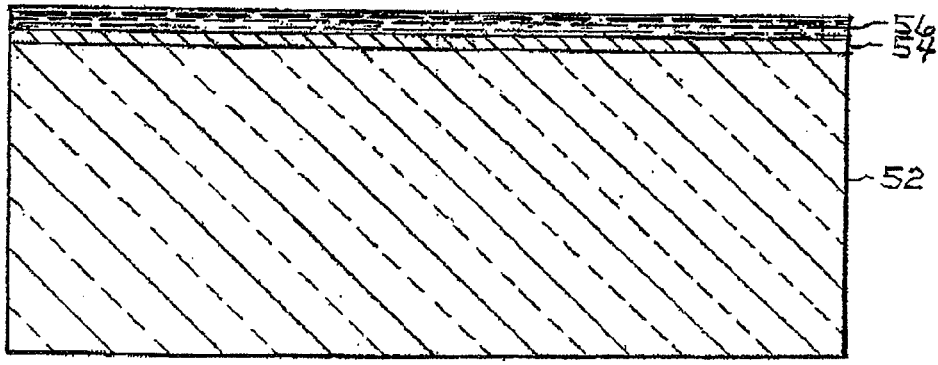
FIGS. 5a-5g illustrate a method of fabricating a crystalline Cu—In—Se film with precursors.
Figure 5B:
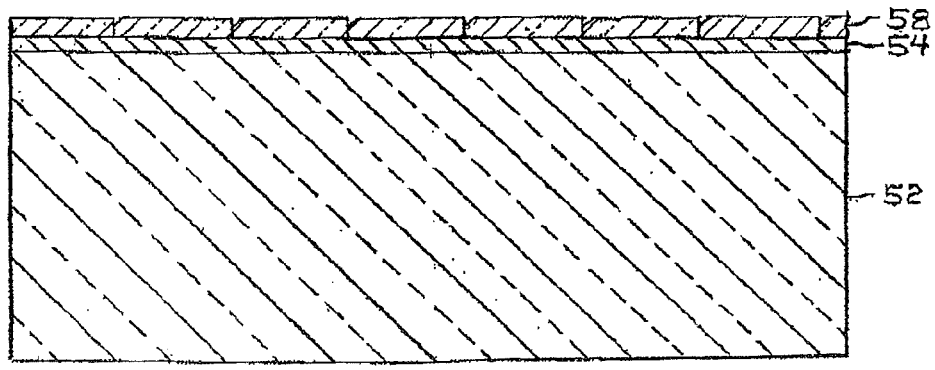

One example approach illustrated in FIGS. 5a-5g is to first prepare an appropriate substrate for supporting the desired CIS or CIGS films. In the example illustrated in FIGS. 5a-5g, a CIS film is fabricated as an absorber layer for a solar cell or other photovoltaic device. Therefore, referring to FIG. 5a, a substrate 52 is prepared with components needed for a functioning photovoltaic cell, such as depositing a layer 54 of molybdenum or other conductive material on a glass substrate 52 to provide a backside electrical contact for the cell. Then, either the liquid-based In—Se precursor or the liquid-based Cu—Se precursor, or, both, can be dispersed on the molybdenum-coated substrate 52, as illustrated in FIG. 5a, where a film 56 of the liquid-based precursor for In—Se is dispersed on the back-side contact layer 54. In this description, a liquid-based precursor means a precursor in which the In—Se or Cu—Se constituents are in a liquid solution, suspension, slurry, or other mixture such that the In—Se or Cu—Se constituents can be handled and applied in a liquid matrix, i.e., one that is incompressible and flowable, so that it can be poured, dropped, sprayed, brushed, spun, or applied with other methods or with other equipment or tools that are typically used for liquid substances. Such liquid-based precursors are sometimes also called inks. Accordingly, the liquid-based In—Se precursor or ink 56, for example, but not for limitation, the nano-$In_3Se_2$ or a $In_2Se_4$-ethylene diamine coordination compound described above, can be applied and dispersed uniformly on the back-side contact layer 54 by dropping, spinning, brushing, spraying, ink-jet dispensing or printing, etc. One example method is to heat the substrate 52, contact layer 54, and precursor film 56 enough to vaporize the organics and liquid matrix to leave a layer of the In—Se constituents on the contact layer 54 and then to anneal the In—Se with rapid thermal processing (RTP) to form a crystalline In—Se film 58, as illustrated in FIG. 5b. If the precursor 56 is, for example, the liquid $In_2Se_4$-ethylene diamine, a Se may be lost during the RTP so that the resulting layer 58 is crystalline $In_2Se_3$. On the other hand, if the precursor 56 is, for example, the nano-$In_2Se_3$ described above, the resulting layer 58 can be processed rapidly by RTP to give a crystalline $In_2Se_3$ film or processed in a conventional furnace with flowing Ar, where Se is lost and crystalline InSe is produced.

Figure 5C:
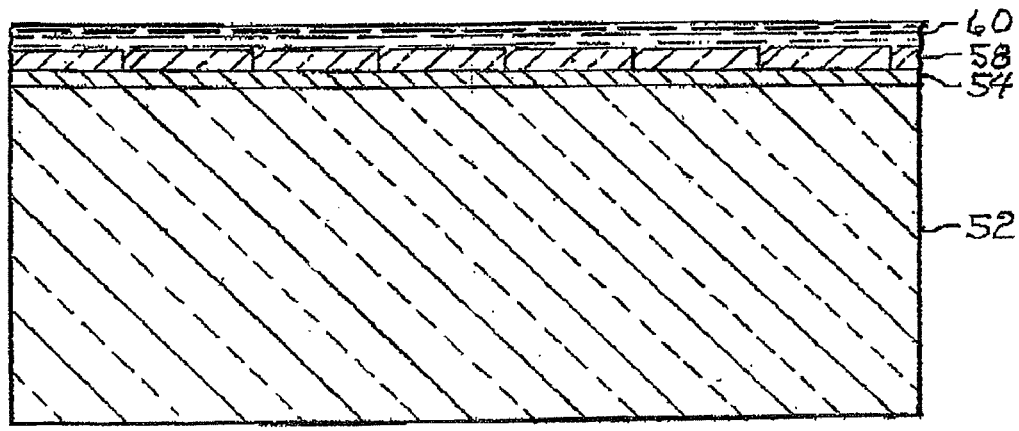
Figure 5D:
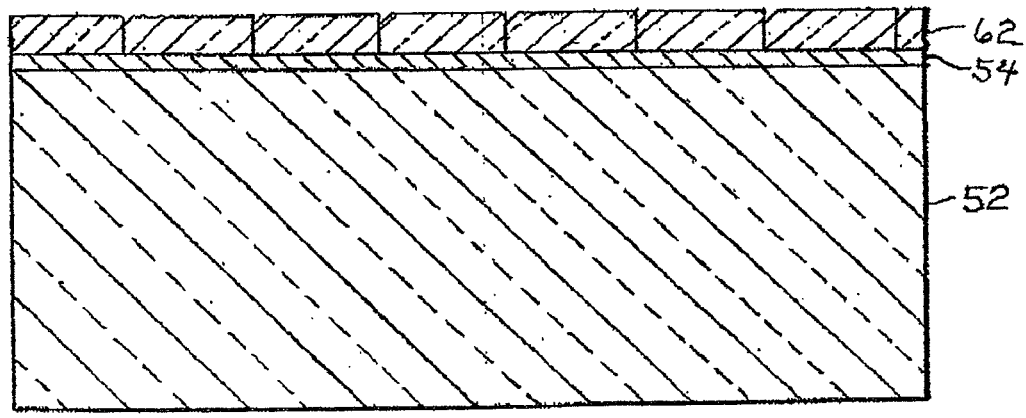

If it is desired to make the In—Se film thicker in order to fabricate a thicker absorber layer, the process of dispersing a liquid-based precursor, heating to vaporize and drive off organics and/or liquid matrix, and RTP the remaining In—Se to produce crystalline In—Se can be repeated as many times as desired. For example, as illustrated in FIG. 5c, a second film 60 of one of the liquid-based In—Se precursors discussed above is dispersed on the crystalline In—Se 58, heated to vaporize and drive away the organics and/or liquid matrix, and then annealed by RTP to form a thicker crystalline In—Se film 62, as illustrated in FIG. 5d. Any number of additional In—Se layers can be added to achieve a desired thickness by repeating this procedure.

Figure 5E:
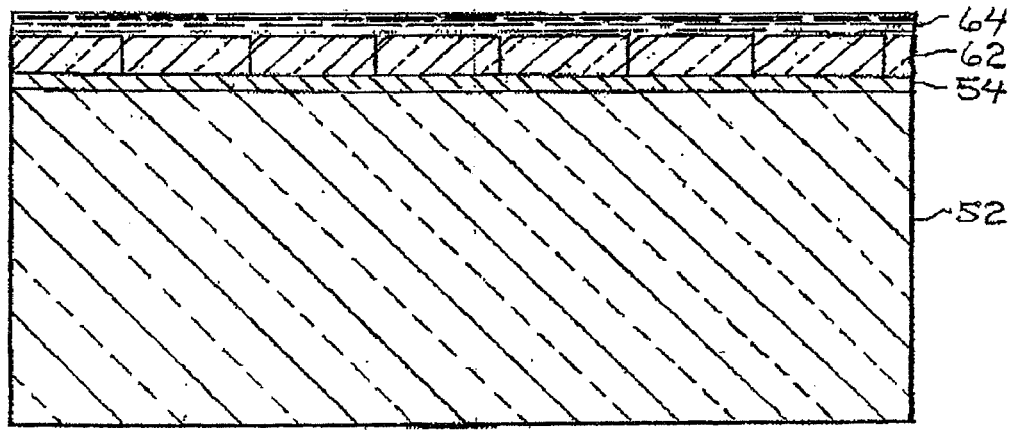
Figure 5F:
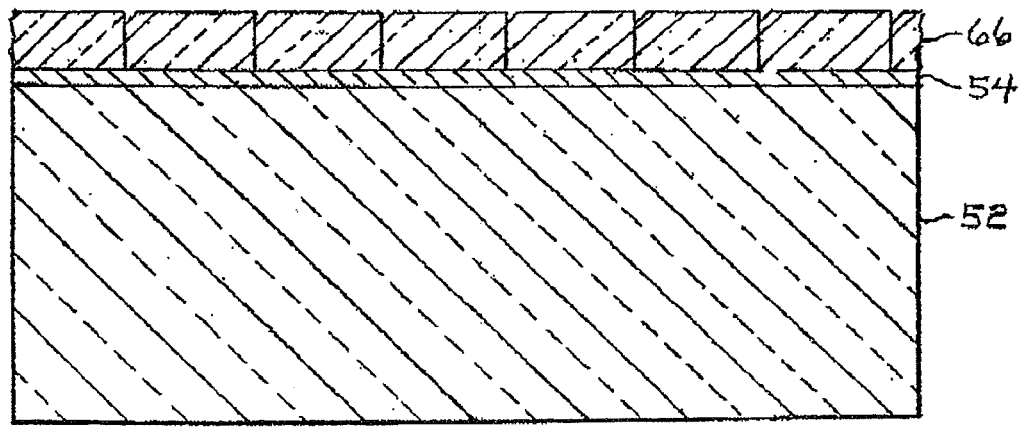

After the crystalline In—Se film 62 is built to the desired thickness, a film 64 of the liquid-based Cu—Se precursor is dispersed on the In—Se film 62, as illustrated in FIG. 5e. The liquid-based Cu—Se precursor can be, for example, but not for limitation, either the copper n-butyl selenide or the $Cu_2Se_x$-ethylene diamine described above. The Cu—Se precursor is heated to vaporize and drive away the organics and/or the liquid matrix to leave the Cu and Se constituents of the film 64, which is then annealed together with the crystallized In—Se film 62 by RTP to form a crystallized Cu—In—Se film 66, as illustrated in FIG. 5f. If, for example, the Cu—Se constituents of the film 64, after driving away the organics and/or liquid matrix, are $Cu_2Se$, after the RTP annealing with the underlying $In_2Se_3$ film 62, crystalline $CuInSe_2$ forms according to the equation:

$$Cu_2Se + In_2Se_3 \rightarrow 2CuInSe_2 \qquad (4)$$

Figure 5G:
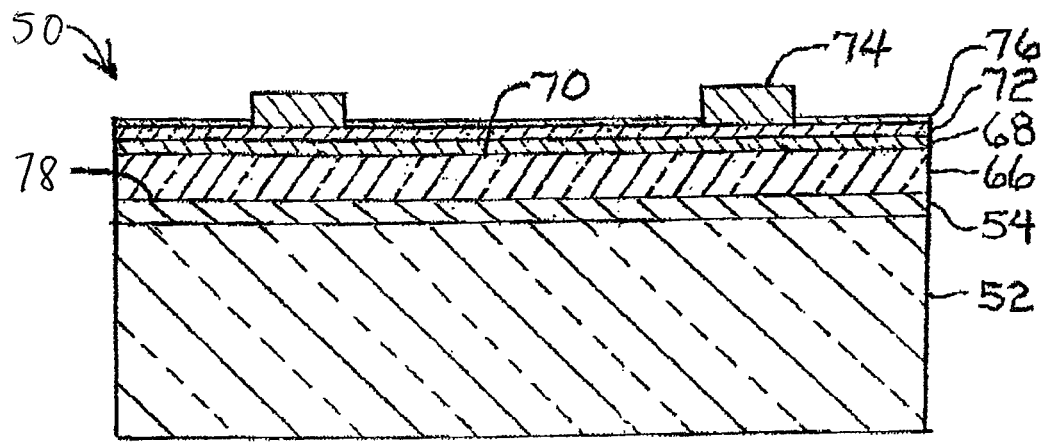

This crystalline Cu—In—Se layer 66 can be the CIS absorber layer of a solar cell or other photovoltaic cell 50 as illustrated in FIG. 5g. Therefore, to complete the photovoltaic ceil 50 in an example conventional manner, another different material 68, such as a Group II-VI material, for example, ZnS or CdS, can be deposited on the CIS absorber layer 66 to create a heterojunction 70. Then, a transparent conductive layer 72, for example, ZnO, can be deposited on the heterojunction layer 68, followed by a metal contact grid 74, anti-reflective coating 76, and any other conventional component needed to complete the photovoltaic device 50, as is well known to persons skilled in the art.

Figure 6:
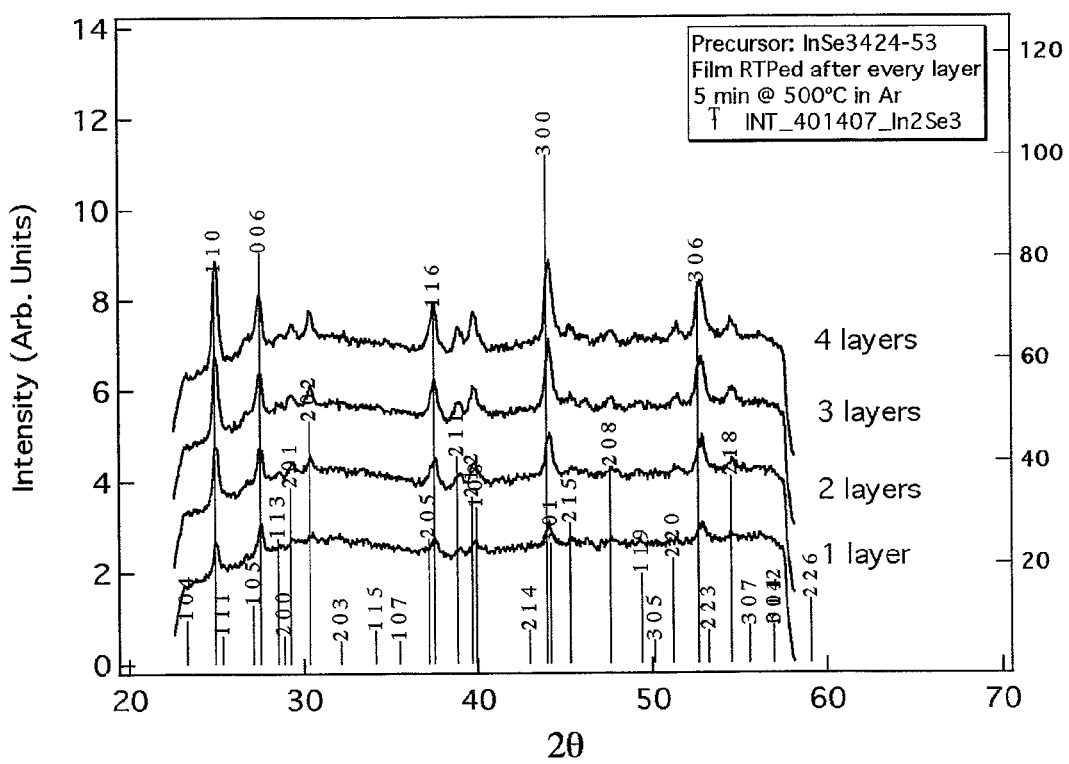
FIG. 6 is an XRD scan of $In_2Se_3$ films thickened with four successive $In_2Se_4(enH)_x(N_2H_5)_{2-x}(en)_y(N_2H_4)_z$ precursor layers.

Experiments have shown that depositing crystalline $In_2Se_3$ film from the liquid-based precursors first and then depositing a $Cu_2Se$ containing film on top of the crystalline $In_2Se_3$ followed by RTP of the stacked films results in the direct formation of crystalline $CuInSe_2$. Also, the absorber layer can be thickened as desired through the deposition and processing of successive $In_2Se_3$ layers to achieve the desired thickness and then processing with the CuSe or $Cu_2Se$ material as explained above. In a typical conventional CIS cell, the absorber layer typically has a thickness of about 3.0 μm or less. The initial In—Se film 58 formed on the Mo-coated substrate 52 described above using the liquid $In_2Se_4$-ethylene diamine precursor material described above deposited by spin coating is about 150 nm thick, and, if processed immediately with Cu—Se, forms a CIS layer about 200 nm thick. However, experiments have shown that adding successive new In—Se layers by spin coating with the same liquid $In_2Se_4$-ethylene diamine precursor adds about 1.50 nm of thickness to the crystalline In—Se film. As shown by the XRD scan in FIG. 6 of four successive $In_2Se_3$ thickening layers, the XRD signal becomes stronger with each successive thickening cycle, and the crystalline $In_2Se_3$ product stays the same throughout the thickening process with no new phases of In—Se formed. These XRD scans in FIG. 6 also indicate that the crystal quality increases with each successive heat treatment (firing).

Both the applications of the liquid-based precursors for the In—Se and Cu—Se layers and the heat treatments to form the crystalline layers can be done at atmospheric pressure. It is preferred, but not essential, to form the In—Se first, because large grain crystalline In—Se forms more readily than large grain Cu—Se. Once the large grain In—Se (e.g., $In_2Se_3$) is formed, similarly large grain crystalline $CuInSe_2$ tends to form on the large grain In—Se (e.g., $In_2Se_3$) template. However, as mentioned above, the Cu—Se can be formed first and followed by the In—Se, or the In—Se and Cu—Se precursors can be mixed and/or deposited simultaneously, and then heal processed to form the Cu—In—Se films. In general, though, larger grained materials tend to have better electrical characteristics than smaller grained materials of the same compounds. All the heat treatments have been done in a rapid thermal processing (RTP) furnace under argon at atmospheric pressure. Rapid thermal processing is necessary to avoid excessive Se loss from the films while the use of an inert atmosphere is used to avoid formation of In—O and Cu—O in the high-temperature step.

Example VII

The In—Se precursor solution of $In_2Se_4$-ethylene diamine prepared in Example VI was spin coated onto plasma-cleaned glass microscope slides by first covering the substrate with precursor solution (3-5 drops from a syringe) and then spinning the substrate at 2500 rpm for one minute. This precursor film was then placed on a silicon susceptor inside a quartz tube in an optical rapid thermal process (RTP) furnace that was then evacuated and re-filled with Ar or thoroughly purged with Ar to remove oxygen. The sample was then processed at 500° C. for five minutes in flowing Ar (flow>100 sccm) to give an $In_2Se_3$ film ~150 nm thick. This spin coating and annealing process was repeated four times to produce the films characterized in FIG. 6. The same process was also carried out using molybdenum-coated soda lime glass (Mo-glass) substrates with similar results.

Example VIII

Copper was added to $In_2Se_3$ films on Mo-glass substrates by spin coating the $Cu_2Se_2(en)_x$ precursor solution prepared in Example III onto the $In_2Se_3$ films using the procedure described above. The resulting films were then processed in the Ar-purged RTP furnace at 500° C. for five minutes to form crystalline $CuInSe_2$ films. Addition of sub-stoichiometric amounts of Cu precursor resulted in incomplete conversion to CIS and $In_2Se_3$ and an intermediate In—Se phase was observed in the XRD patterns (at 2θ=28.6, 37.0 and 48.4) of such films. Layers of copper precursor were added stepwise to these films until they were completely convened to CIS, as evidenced by the disappearance of the intermediate In—Se phase peaks in the XRD pattern. This method was used to produce the film characterized in FIG. 7.

Example IX

CIS films were also prepared directly by spin coating a mixed precursor followed by RTP processing. The $In_2Se_4$-ethylene diamine precursor solution prepared in Example VI was mixed in a 1:1 ratio with water and this solution was mixed in equal amounts with the $Cu_2Se_x$-ethylene diamine precursor solution prepared in Example III to make a mixed precursor solution containing approximately equal concentrations of In and Cu. This solution was spin coated on Mo-glass substrates as described above. The resulting films were then processed in the Ar-purged RTP furnace at 500° C. for five minutes to form crystalline $CuInSe_2$ films.

Example X

Films were also deposited by spray coating using a Paasche Model H#3 or H#5 airbrush. Films were sprayed onto cleaned microscope slides or Mo-glass substrates mounted on an inclined hot stage maintained at the desired deposition temperature. For $In_2Se_3$ films, the $In_2Se_4$-ethylene diamine precursor solution from Example VI was placed in the airbrush reservoir and spray deposited onto substrates at temperatures between 100 and 300° C. The resulting precursor films were annealed in the Ar-purged RTP furnace at 500° C. for five minutes to produce crystalline $In_2Se_3$ films with thicknesses between 0.5 and 3 μm (see FIG. 8—lower trace). $Cu_2Se$ films were prepared in an analogous way by spraying the $Cu_2Se_x$-ethylene diamine precursor solution prepared in Example III onto substrates at a temperature range between 100 and 300° C. followed by RTP processing in Ar at 500° C. for five minutes.

Figure 8:
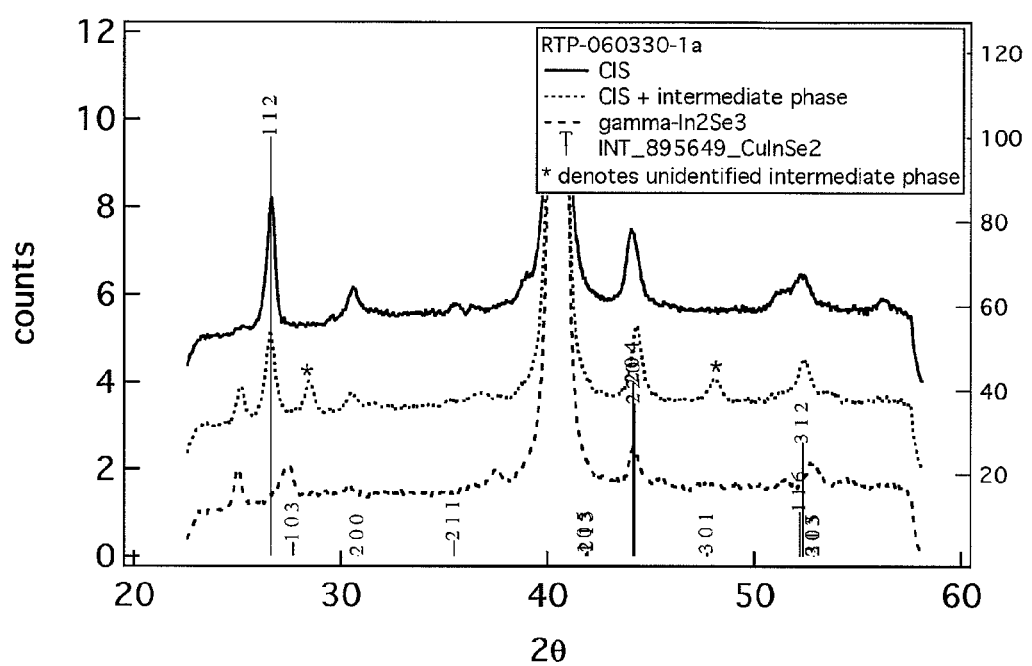
FIG. 8 is an XRD scan showing various phases of deposition and material growth upon addition of Cu precursor material to an $In_2Se_3$ film including a Cu-poor intermediate phase and complete conversion to CIS.

Also, spray deposition and RTP processing of an $In_2Se_3$ film as described in this example, followed by spray deposition of the Cu precursor (e.g., the $Cu—Se_x$-ethylene diamine) and RTP processing at 500° C. for five minutes resulted in the formation of crystalline CIS films. FIG. 8 shows XRD characterization of this process, including the deposition of too little Cu in the first addition, leading to formation of the intermediate Cu—In—Se phase, and the complete conversion to CIS upon addition of more Cu followed by further processing at 500° C. for five minutes. In FIG. 8, the bottom trace shows a γ-$In_2Se_3$ crystalline film produced by spraying the $In_2Se_4$-ethylene diamine precursor and processing for five minutes at 500° C. The center trace shows the same film sprayed with a layer of the $Cu_2Se_x$-ethylene diamine precursor and processed again for five minutes at 500° C. showing conversion to CIS and an intermediate Cu—In—Se phase (marked with asterisks in FIG. 8). The top trace shows the same film sprayed with more Cu precursor (e.g., $Cu_2Se_x$-ethylene diamine) and processed again for five minutes at 500° C. showing the complete conversion to CIS.

Example XI

Figure 9:
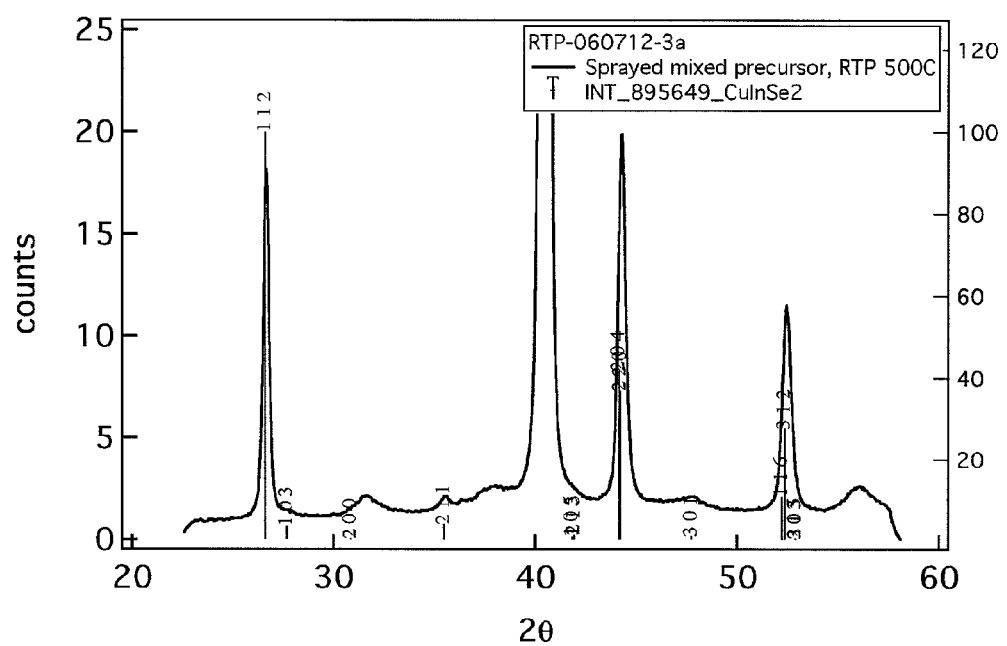
FIG. 9 is an XRD scan of a CIS film produced by a mixed precursor comprising both Cu and In that was sprayed on a Mo-glass substrate and processed at 500° C. for five minutes.

CIS films were also prepared directly by spray deposition of a mixed precursor followed by RTP processing. The $In_2Se_4$-ethylene diamine precursor solution prepared in Example IV was mixed in a 1:1 ratio with water and this solution was mixed in equal parts with the $Cu_2Se_x$-ethylene diamine precursor solution prepared in Example III to make a mixed precursor solution containing approximately equal concentrations of In and Cu. This mixed precursor solution was sprayed on Mo-glass substrates at temperatures between 100 and 300° C. as described above. The resulting films were then processed in the Ar-purged RTP furnace at 500° C. for five minutes to form crystalline $CuInSe_2$ films, characterized by the XRD scan in FIG. 9.

Figure 7:
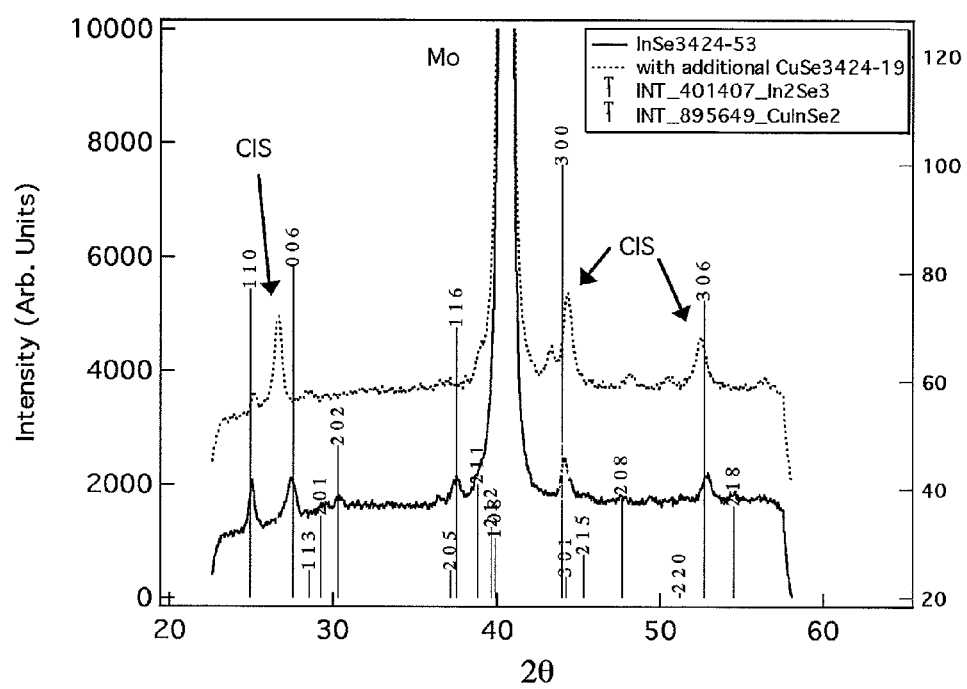
FIG. 7 is an XRD scan of an $In_2Se_3$ film made from liquid precursors on Mo coated glass and an XRD scan of the same film after firing it with an additional liquid precursor-based $Cu_2Se$ film on top.

As shown in FIG. 7, the XRD of the initial $In_2Se_3$ film on molybdenum-coated glass as well as the XRD of the same film after addition of the second layer of $In_2Se_3$ and firing (annealing) of the two-layer stack matches the expected X-ray pattern for crystalline $\gamma$-$In_2Se_3$ almost perfectly. It can also be seen in FIG. 7 that the addition of the Cu—Se precursor to the crystalline two-layer stack of $In_2Se_3$ produces crystalline $CuInSe_3$ directly. This result suggests that the reaction occurs by diffusion of $Cu_2Se$ into the $In_2Se_3$ film and that the initial crystallinity of the $In_2Se_3$ film is maintained in the product CIS film. The use of films of the crystalline In—Se phase can be even more advantageous in this regard. The lower trace in FIG. 7 shows the XRD pattern of a thickened $In_2Se_3$ film, while the upper trace shows the same film after addition of the Cu precursor layer (e.g., $Cu_2Se_x$-ethylene diamine) and processing at 500° C. for five minutes.

Example XII

Figure 10:
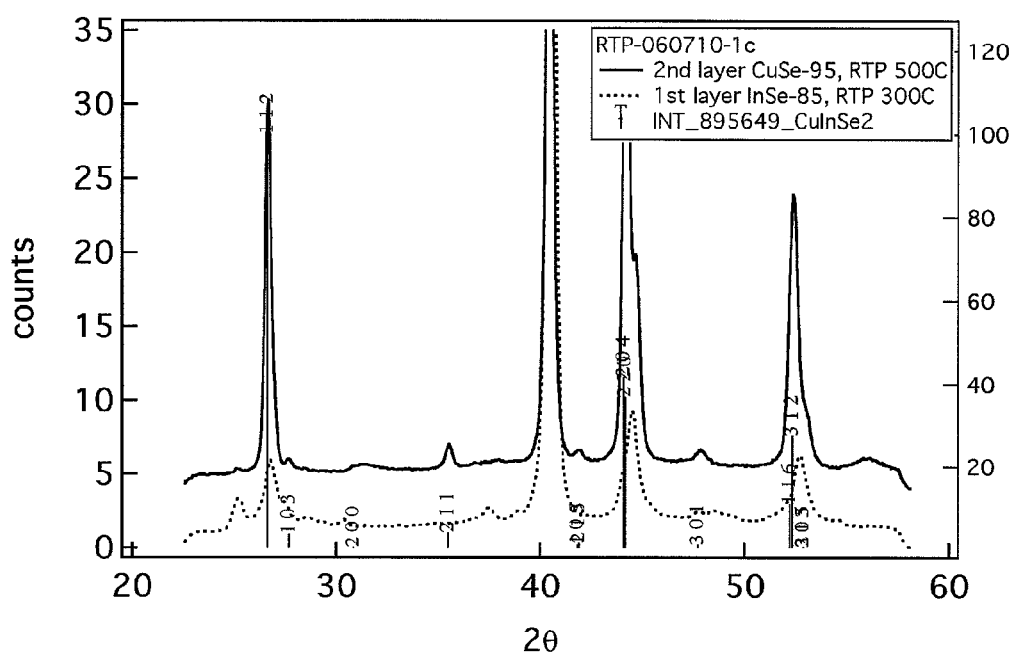
FIG. 10 is an XRD scan of CIS formed by reaction of crystalline In—Se with $Cu_2Se_x$-ethylene diamine precursor.

CIS films were also produced by adding Cu to films of the crystalline In—Se phase. The $In_2Se_4$-ethylene diamine precursor solution from Example VI was placed in the airbrush reservoir and spray deposited onto a Mo-glass at 100° C. The resulting precursor film was annealed in the Ar-purged RTP furnace at 300° C. for five minutes to give a crystalline In—Se film, as shown in the lower trace of FIG. 10. Cu was added to this film by spraying the $Cu_2Se_x$-ethylene diamine precursor solution prepared in Example III at a temperature of 100° C. followed by RTP processing in Ar at 500° C. for five minutes. The result was the crystalline CIS film characterized in the top trace of FIG. 10. In FIG. 10, the lower trace corresponds to the crystalline In—Se phase obtained by annealing the $In_2Se_4$-ethylene diamine precursor film at 300° C. for five minutes, and the upper trace is obtained from the CIS that resulted from the addition of the $Cu_2Se_x$-ethylene diamine followed by processing at 500° C. for five minutes.

For CIS photovoltaic cells, the light to electrical energy conversion efficiency can be improved by adding Ga to the material, and the resulting material is often called CIGS, or Cu(In,Ga)(S,Se) as explained above, it is generally believed that the Ga presence is most beneficial, at the Mo/CIS interface 78 (FIG. 5g). In conventional vacuum deposited CIGS films, it is very difficult to limit the Ga presence to the Mo/CIS interface 78, so the Ga ends up being dispersed throughout the entire CIGS absorber layer. However, with this process, Ga can be added to just the first layer 56 (FIG. 5a) of several successive Ga—Se precursor layers by adding a liquid-based Ga—Se precursor material to the liquid-based In—Se precursor for the first layer 56 (FIG. 5a). Then, after heat treatment to crystallize the first layer 58 (FIG. 5b) of $In_{1-x}Ga_xSe_2$, $0<x<1$, the rest of the In—Se thickening layers are formed without Ga. Of course, the Ga can also be included in all the In—Se layers to produce a CIGS absorber layer with Ga throughout the absorber layer 66 if desired.

In the example described above, the In—Se (or In—Ga—Se) is developed first and then the Cu—Se is added, as described above. Other sequences could also be used. For example, alternating layers of In—Se and Cu—Se can be developed until the desired thickness is obtained.

Another method includes mixing the respective liquid-based precursors for In—Se and Cu—Se together in proportions that provide equal Cu and In (or slightly less Cu than In to get the desired Cu and In stoichiometric proportions) and then depositing the mixture by any of the methods and/or instrumentalities explained above on the substrate and annealing it to produce the CIS film. This method requires annealing by RTP in temperatures reaching 500° C. in argon for about live minutes in order to get crystalline films.

While a number of example aspects, implementations, and embodiments have been discussed above, persons skilled in the art will recognize certain modifications, permutations, additions, variations, and subcombinations thereof. It is therefore intended that the following appended claims hereafter introduced are interpreted to include all such modifications, permutations, additions, and subcombinations as are within their true spirit and scope. The words "comprise," "comprises," "comprising," "comprised," "compose," "composing," "composed," "have," "having," "include," "including," and "includes" when used in this specification and in the following claims are intended to specify the presence of stated features or steps, but they do not preclude the presence or addition of one or more other features, steps, or groups thereof.

We claim:

1. A method of forming a thin film layer of copper-indium-selenide, comprising:
    dispersing a liquid-based In—Se precursor comprising In and Se in a liquid matrix on a substrate;
    heating the liquid-based precursor comprising the In and Se in the liquid matrix to vaporize and drive away the liquid matrix, to decompose the precursor comprising the In and Se, to vaporize ligands from the decomposed In—Se precursor, to vaporize volatile products from the In—Se precursor including Se and/or $H_2Se$, and to form and anneal crystalline In—Se on the substrate;
    cooling the annealed crystalline In—Se film on the substrate;
    dispersing a liquid-based Cu—Se precursor comprising Cu and Se in a liquid matrix on the crystalline In—Se film; and
    heating the liquid-based Cu—Se precursor comprising the Cu and Se in the liquid matrix to vaporize and drive away the liquid matrix, to decompose the Cu—Se precursor comprising the Cu and Se, to vaporize ligands from the decomposed Cu—Se precursor, to vaporize volatile products from the Cu—Se precursor including Se and/or $H_2Se$, and to form and anneal crystalline Cu—Se together with the crystalline In—Se film to form a crystalline Cu—In—Se film.

2. The method of claim 1, wherein the liquid-based In—Se precursor comprising In and Se in a liquid matrix includes a liquid $In_2Se_4$-ethylene diamine solution.

3. The method of claim 1, wherein the liquid-based In—Se precursor comprising In and Se in a liquid matrix includes a nano-$In_2Se_3$ precursor suspension.

4. The method of claim 1, wherein the liquid-based Cu—Se precursor comprising Cu and Se in a liquid matrix includes a copper-organoselenide precursor solution.

5. The method of claim 4, wherein the copper-organoselenide includes a copper alkyl selenide.

6. The method of claim 5, wherein the copper alkyl selenide includes copper n-butyl selenide.

7. The method of claim 4, wherein the copper-organoselenide includes a copper aryl selenide.

8. The method of claim 4, wherein the liquid matrix includes a solvent and a dispersant.

9. The method of claim 8, wherein the solvent includes DMSO.

10. The method of claim 8, wherein the dispersant includes triethanol amine.

11. The method of claim 4, wherein the liquid matrix includes DMSO.

12. The method of claim 4, wherein the liquid matrix includes a mixture of hydrazine and ethylene diamine.

13. The method of claim 1, wherein the liquid-based Cu—Se precursor comprising Cu and Se in a liquid matrix includes a $Cu_2Se_x$-ethylene diamine solution, where $1 \leq x \leq 12$.

14. The method of claim 13, wherein the $Cu_2Se_x$-ethylene diamine solution includes a $Cu_2Se_x$-ethylene diamine coordination compound, where $1 \leq x \leq 12$.

15. The method of claim 14, wherein the $Cu_2Se_2$-ethylene diamine coordination compound includes $Cu_2Se_x(en)_y$, where $1 \leq x \leq 12$ and $y \geq 1$.

16. The method of claim 1, wherein the crystalline In—Se film comprises crystalline $In_2Se_3$.

17. The method of claim 1, wherein the crystalline Cu—In—Se film comprises crystalline $CuInSe_2$.

18. The method of claim 1, including, before dispersing the liquid-based Cu—Se precursor comprising the Cu and In on the In—Se film, dispersing an additional film of the liquid-based In—Se precursor comprising In and Se in a liquid matrix on the crystalline In—Se film, heating the additional film of the liquid-based In—Se precursor comprising the In and Se in the liquid matrix to vaporize and drive away the liquid matrix, to decompose the In—Se precursor comprising the In and Se, to vaporize ligands from the decomposed In—Se precursor, to vaporize volatile products from the In—Se precursor including Se and/or $H_2Se$, and to form and anneal additional crystalline In—Se to form a thickened crystalline In—Se film.

19. The method of claim 1, wherein the liquid-based In—Se precursor comprising the In and Se in a liquid matrix includes a slurry of $In_2Se_3$ nanoparticles.

20. The method of claim 1, wherein said heating the liquid-based In—Se precursor comprising the In and Se includes heating the liquid-based In—Se precursor comprising the In and Se to a temperature in a range of 300 to 650° C.

21. The method of claim 1, wherein said heating the liquid-based In—Se precursor comprising the In and Se includes heating the liquid-based In—Se precursor comprising the In and Se to a temperature in a range of 400 to 550° C.

22. The method of claim 1, wherein said heating the liquid-based In—Se precursor comprising the In and Se includes heating the liquid-based In—Se precursor comprising the In and Se to a temperature in a range of 400 to 550° C. in a time range of one to ten minutes.

23. The method of claim 1, wherein said heating the liquid-based In—Se precursor comprising the In and Se includes heating the liquid-based In—Se precursor comprising the In and Se to a temperature in a range of 400 to 550° C. in a time range of four to six minutes.

24. The method of claim 1, wherein said heating the liquid-based Cu—Se precursor comprising the Cu and Se includes heating the liquid-based Cu—Se precursor comprising the Cu and Se to a temperature in a range of 150 to 650° C.

25. The method of claim 1, wherein said heating the liquid-based Cu—Se precursor comprising the Cu and Se includes heating the liquid-based Cu—Se precursor comprising the Cu and Se to a temperature in a range of 350 to 550° C.

26. The method of claim 1, wherein said heating the liquid-based Cu—Se precursor comprising the Cu and Se includes heating the liquid-based Cu—Se precursor comprising the Cu and Se to a temperature in a range of 350 to 550° C. in a time range of one to ten minutes.

27. The method of claim 1, wherein said heating the liquid-based Cu—Se precursor comprising the Cu and Se includes heating the liquid-based Cu—Se precursor comprising the Cu and Se to a temperature in a range of 350 to 550° C. in a time range of four to six minutes.

* * * * *